United States Patent
Kim

(10) Patent No.: US 9,312,915 B2
(45) Date of Patent: Apr. 12, 2016

(54) DISCONNECTION DETECTING APPARATUS AND METHOD

(71) Applicant: LSIS CO., LTD., Anyang-si, Gyeonggi-do (KR)

(72) Inventor: Jung Wook Kim, Cheonan-si (KR)

(73) Assignee: LSIS Co., Ltd., Anyang-Si, Gyeonggi-Do (KR)

( * ) Notice: Subject to any disclaimer, the term of this patent is extended or adjusted under 35 U.S.C. 154(b) by 243 days.

(21) Appl. No.: 14/042,328

(22) Filed: Sep. 30, 2013

(65) Prior Publication Data

US 2014/0118002 A1 May 1, 2014

(30) Foreign Application Priority Data

Oct. 30, 2012 (KR) .................. 10-2012-0121241

(51) Int. Cl.
*H04B 3/46* (2015.01)
*G01R 31/02* (2006.01)
*G01R 31/04* (2006.01)

(52) U.S. Cl.
CPC .............. *H04B 3/46* (2013.01); *G01R 31/026* (2013.01); *G01R 31/041* (2013.01)

(58) Field of Classification Search
CPC .............. G01R 31/026; G01R 31/025; G01R 19/0084; G01R 19/155; G01R 27/18; G01R 31/021; G01R 31/024; G01R 31/04; G01R 31/3277; G01R 31/362; B60R 16/03; H02P 29/025; H02P 8/36; G05F 1/577
See application file for complete search history.

(56) References Cited

U.S. PATENT DOCUMENTS

| 7,965,475 B2 | 6/2011 | Morino |
| 2008/0278868 A1* | 11/2008 | Morino .......................... 361/18 |
| 2010/0176870 A1* | 7/2010 | Kohamada .................... 327/518 |

FOREIGN PATENT DOCUMENTS

| CN | 1182306 | 5/1998 |
| CN | 1376929 | 10/2002 |
| CN | 2781390 | 5/2006 |
| CN | 201413376 | 2/2010 |
| JP | 59-119280 | 7/1984 |
| JP | 60-063473 | 4/1985 |
| JP | 63-277981 | 11/1988 |

(Continued)

OTHER PUBLICATIONS

Japan Patent Office Application Serial No. 2013-223057, Office Action dated Aug. 19, 2014, 4 pages.

(Continued)

*Primary Examiner* — Vinh Nguyen
(74) *Attorney, Agent, or Firm* — Lee, Hong, Degerman, Kang & Waimey

(57) ABSTRACT

Provided is a disconnection detecting apparatus for detecting whether there is a disconnection between a current signal output device and an external device receives the current signal of a PLC analog current output module. The disconnection detecting apparatus according to an embodiment includes a monitoring unit generating different voltages according to whether a current signal input from the current signal output device is applied to the external device, a reference voltage generating unit generating a reference voltage, a comparing unit outputting a voltage according to a result obtained by comparing the voltage generated from the monitoring unit with the reference voltage, and a switching unit outputting a disconnection detecting signal on the basis of the voltage output from the comparing unit.

9 Claims, 4 Drawing Sheets

(56) References Cited

FOREIGN PATENT DOCUMENTS

| | | |
|---|---|---|
| JP | 03-130739 | 12/1991 |
| JP | 06-94772 | 4/1994 |
| JP | 06-207961 | 7/1994 |
| JP | 08146069 | 6/1996 |
| JP | 09-318690 | 12/1997 |
| JP | 2003-185692 | 7/2003 |
| JP | 2004-245747 | 9/2004 |
| JP | 2006-229864 | 8/2006 |
| KR | 20-0139886 | 4/1999 |
| KR | 10-2011-0137440 | 12/2011 |
| WO | 2011/162240 | 12/2011 |

OTHER PUBLICATIONS

European Patent Office Application Serial No. 13186811.9, Search Report dated Mar. 5, 2014, 6 pages.
Korean Intellectual Property Office Application Serial No. 10-2012-0121241, Office Action dated Oct. 16, 2013, 4 pages.
Japan Patent Office Application Serial No. 2013-223057, Office Action dated May 8, 2014, 2 pages.
The State Intellectual Property Office of the People's Republic of China Application Serial No. 201310516497.8, Office Action dated Nov. 30, 2015, 8 pages.

* cited by examiner

Fig. 4

| STATE OF EXTERNAL WIRING | IN− | IN+ | OUT | FET1상태 | DISCONNECTION DETECTING SIGNAL | TEST CONDITION |
|---|---|---|---|---|---|---|
| DISCONNECTION | +18V | +13.44V | −12V | On | 0V | |
| NORMAL (WIRE CONNECTION) | 10mV OR LESS | +13.44V | +18V | Off | 5V | Load ≒ 600Ω OR LESS, NO OUTPUT CURRENT |
| NORMAL (WIRE CONNECTION) | 12V OR LESS | +13.44V | +18V | Off | 5V | Load ≒ 600Ω OR LESS, OUTPUT OF 0 −20 mA, OR 4−20 mA |

DISCONNECTION DETECTING APPARATUS AND METHOD

CROSS-REFERENCE TO RELATED APPLICATION

Pursuant to 35 U.S.C. §119(a), this application claims the benefit of earlier filing date and right of priority to Korean Application No. 10-2012-0121241, filed on Oct. 30, 2012, the contents of which is incorporated by reference herein in its entirety.

BACKGROUND

The present disclosure relates to a disconnection detecting apparatus and method, and more particularly to an apparatus and a method for detecting whether there is a disconnection between a current signal output device such as a PLC analog current output module and an external device which receives the current signal.

Various current signal output devices are being used for transmitting a current signal to other devices. An analog current output module used in a programmable logic controller (PLC) is an example of the current signal output devices, which transmits a direct current ranging from about 0 mA to about 20 mA, or from about 4 mA to about 20 mA to the external devices.

However, if a wiring state between the current signal output devices and the external devices is bad, current does not flow therebetween.

If operators check the wiring state with naked eyes, it is often difficult to detect disconnection exactly. The disconnection may occur due to various factors, for example, when a wire of which a sheath is undesirably peeled off is connected to a terminal block of an analog current output module or a terminal block of the external device, or when electrical conduction state becomes poor due to foreign substances introduced between the wire and a pin of the terminal block.

Here, if operators are not able to check the wiring state exactly and determine that the analog current output module itself has a problem, this causes the operators to spend significant time and costs for trouble shooting.

SUMMARY

Embodiments provide a disconnection detecting apparatus capable of detecting a connection state between all kinds of current signal output devices such as a PLC analog current output module and external devices.

Embodiments also provide a disconnection detecting apparatus according to an embodiment including a monitoring unit generating different voltages according to whether a current signal input from the current signal output device is applied to the external device; a reference voltage generating unit generating a reference voltage; a comparing unit outputting a voltage according to a result obtained by comparing the voltage generated from the monitoring unit with the reference voltage; and a switching unit outputting a disconnection detecting signal on the basis of the voltage output from the comparing unit.

BRIEF DESCRIPTION OF THE DRAWINGS

FIG. 4 is an exemplary table showing an operation state of the disconnection detecting apparatus according to an embodiment.

DETAILED DESCRIPTION OF THE EMBODIMENTS

Terms or words used in the specification and claims should not be construed as being limited to an accepted or lexical meaning, and should be understood as appropriate notions by the inventor based on that he/she is able to define terms to describe his/her invention in the best way to be seen by others.

Therefore, embodiments and drawings described herein are simply exemplary and not exhaustive, and it will be understood that various modifications and equivalents may be made to take the place of the embodiments.

Hereinafter, preferred embodiments will be described below in more detail with reference to the accompanying drawings.

Figure 1:
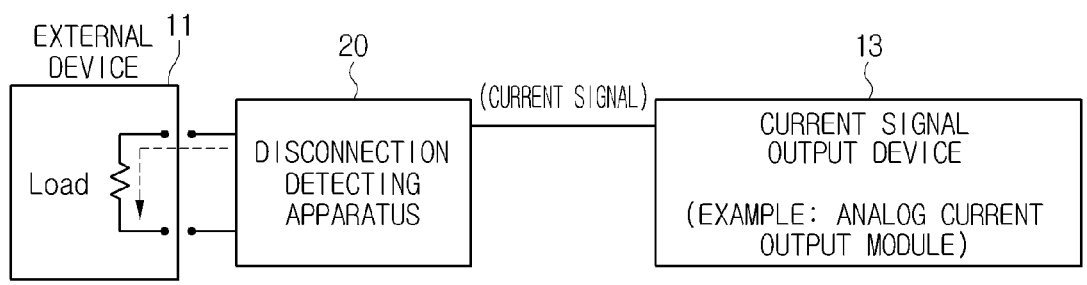
FIG. 1 is a block diagram illustrating a connection between a current signal output device and an external device according to an embodiment.

FIG. 1 is a block diagram illustrating a connection between a current signal output device and an external device according to an embodiment.

Referring to FIG. 1, a current signal output device 13, such as an analog current output module used in programmable logic controllers (PLC), outputs a current signal to an external device 11 connected thereto.

The external device 11 may be various kinds of devices. The current signal output from the current signal output device is transmitted to the external device 11, and the external device 11 is operated according to the current signal. The external device 11 may have various load values. For example, according to the standard of the International Electrotechnical Commission (IEC 6113), the maximum load resistance value is about 600Ω or less.

A disconnection detecting apparatus 20 may detect whether a wire between the current signal output device 13 and the external device 11 is broken.

Figure 2:
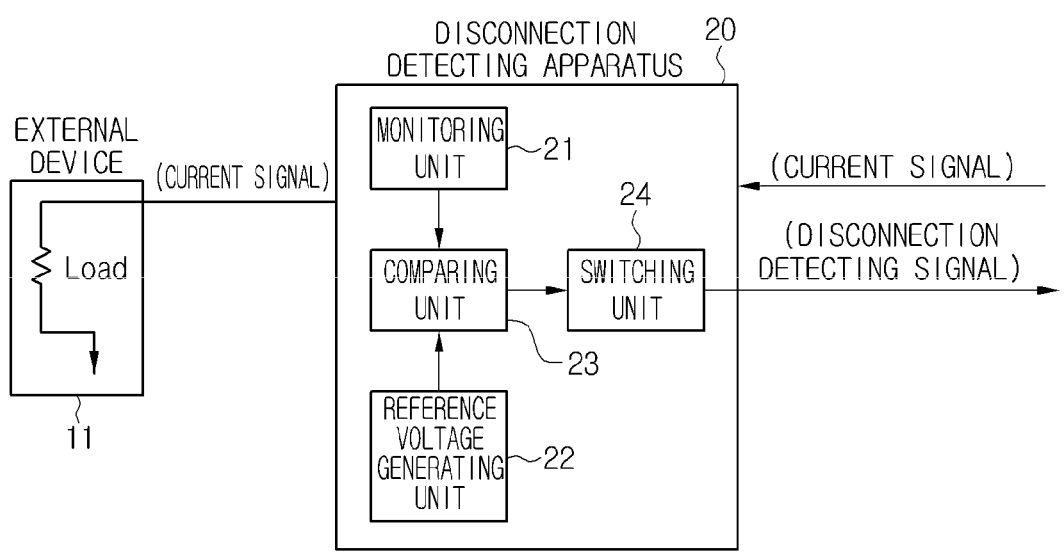
FIG. 2 is a block diagram illustrating an example of a disconnection detecting apparatus according to an embodiment.

FIG. 2 is a block diagram illustrating an example of a disconnection detecting apparatus according to an embodiment.

Referring to FIG. 2, the disconnection detecting apparatus 20 includes a monitoring unit 21, a reference voltage generating unit 22, a comparing unit 23, and a switching unit 24.

The monitoring unit 21 generates different voltages according to whether the current signal input from the current signal output device 13 flows through the external device 11. The reference voltage generating unit 22 generates a reference voltage having a certain level.

For example, the monitoring unit 21 may generate a voltage greater than the reference voltage when the current signal does not flow through the external device 11. Also, the monitoring unit 21 may generate a voltage less than the reference voltage when the current signal flows through the external device 11.

Alternatively, the monitoring unit 21 may generate a voltage less than the reference voltage when the current signal does not flow through the external device 11. Also, the monitoring unit 21 may generate a voltage greater than the reference voltage when the current signal flows through the external device 11.

Thus, the monitoring unit 21 may generate a voltage greater or less than the reference voltage when the current signal does not flow through the external device 11. Also, the monitoring unit 21 may generate a voltage less or greater than the reference voltage when the current signal flows through the external device 11.

The comparing unit 23 may output a positive (+) voltage or a negative (−) voltage according to a difference between the voltage generated from the monitoring unit 21 and the reference voltage.

For example, the comparing unit 23 may output a negative voltage when the voltage generated from the monitoring unit 21 is greater than the reference voltage generated from the reference voltage generating unit 22. Also, the comparing unit 23 may output a positive voltage when the voltage generated from the monitoring unit 21 is less than the reference voltage generated from the reference voltage generating unit 22.

Alternatively, the comparing unit 23 may output a positive voltage when the voltage generated from the monitoring unit 21 is greater than the reference voltage generated from the reference voltage generating unit 22. Also, the comparing unit 23 may output a negative voltage when the voltage generated from the monitoring unit 21 is less than the reference voltage generated from the reference voltage generating unit 22.

The switching unit 24 may output a disconnection detecting signal by using the voltage output from the comparing unit 23. Here, the disconnection detecting signal is referred to as a signal indicating whether a wire is disconnected or not.

That is, the disconnection detecting apparatus 20 may output different voltages depending on states when the wire is disconnected and connected, and thus inform operators of whether the wire is disconnected by using the different voltages.

Figure 3:
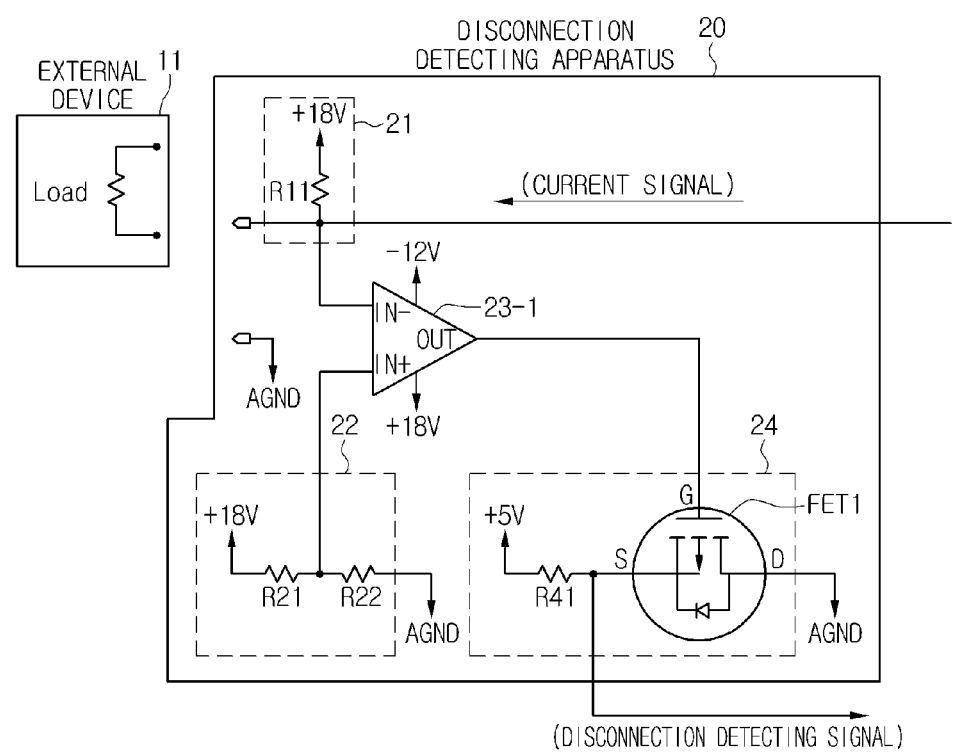
FIG. 3 is an equivalent circuit diagram of the disconnection detecting apparatus according to the embodiment.

FIG. 3 is an equivalent circuit diagram of the disconnection detecting apparatus according to the embodiment.

Referring to FIG. 3, the comparing unit 23 is configured using an operational amplifier (OP Amp) 23-1. The OP Amp 23-1 itself receives voltages of about −12 V and about +18 v. An inverting input terminal (IN−) receives the voltage generated from the monitoring unit 21, and a non-inverting input terminal (IN+) receives the reference voltage generated from the reference voltage generating unit 22.

The monitoring unit 21 may be configured using a resistor element R11 connected between a power supply (for example, a voltage of 18 V) and the inverting input terminal (IN−) of the OP Amp 23-1. Also, a contact of the resistor element connected to the inverting input terminal (IN−) of the OP Amp 23-1 may be connected to a contact through the current signal is output to the external device 11. That is, the current signal input from the current signal output device 13 is transmitted to the external device 11 through the contact of the resistor element R11.

The reference voltage generating unit 22 may be configured by use of dividing resistor elements R21 and R22 connected between the power (for example, a voltage of about 18 V) and a ground.

A common contact of the dividing resistor elements is connected to the non-inverting input terminal (IN+) of the OP Amp 23-1. A voltage of about +18 V is divided by the dividing resistor element to be applied to the common contact of the dividing resistor elements R21 and R22, and thus, the divided voltage is defined as a reference voltage.

The switching unit 24 may be configured using a transistor FET1 of which a gate terminal is connected to an output terminal OUT of the OP Amp 23-1, and a resistor element R41 connected between the power supply (for example, a voltage of about 5 V) and a source terminal of the transistor FET1. Various kinds of transistors are available, for example, a field effect transistor (FET) may be used.

The transistor FET1 of which a drain terminal is connected to the ground AGND, and the transistor FET1 is turned on/off according to an output voltage of the OP Amp 23-1.

Here, the voltage applied to the source terminal of the transistor FET1 may function as the disconnection detecting signal indicating whether the wire is disconnected or not.

FIG. 4 is an exemplary table showing an operation state of the disconnection detecting apparatus according to an embodiment.

Operations of the disconnection detecting apparatus according to the embodiment in FIG. 3 will now be described with reference to FIG. 4.

Here, it is assumed that resistance values of the dividing resistor elements R21 and R22 are 49.9 KΩ and 147 KΩ, respectively, the load resistance value of the external device 11 is about 600Ω or less, and the transistor FET1 is a P channel transistor.

If the wire between the current signal output device and the external device is disconnected, a voltage of +18 V is applied into the inverting input terminal (IN−) of the OP Amp 23-1. Also, a voltage of +13.44 V is applied into the non-inverting input terminal (IN+). Thus, the OP Amp 23-1 outputs the voltage of −12V between the voltage of +18 V and the voltage of −12 V supplied thereto.

Therefore, since the output voltage of the OP Amp 23-1 is negative, the transistor FET1 is turned on to output a ground voltage as the disconnection detecting signal.

However, if the wiring state between the current signal output device and the external device is normal, a voltage applied to the inverting input terminal (IN−) of the OP Amp 23-1 is 10 mV or less (when the current is not output) or 12 V or less (when the maximum output current value is 20 mA). Also, a voltage of +13.44 V is applied to the non-inverting input terminal (IN+). Thus, the OP Amp 23-1 outputs the voltage of +18V between the voltage of +18 V and the voltage of −12 V supplied thereto.

Therefore, since the output voltage of the OP Amp 23-1 is positive, the transistor FET1 is turned off to output a voltage of 5 V as the disconnection detecting signal.

The disconnection detecting signal output from the switching unit 24 may be transmitted to, for example, a micro processor unit (MPU) of the current signal output device 13 to inform operators of whether the wire is disconnected. In the embodiments, the MPU recognizes that the external wire is disconnected when the disconnection detecting signal has a ground voltage.

As necessary, an inputting method of the OP Amp 23-1 and a kind of the transistor of the switching unit 24 may be diversely configured.

For example, when a positive voltage is input to the gate terminal of the transistor FET1, the transistor FET1 is turned on. In this case, the monitoring unit 21 may be connected to the non-inverting terminal of the OP Amp 23-1, and the reference voltage may be connected to the inverting input terminal.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A disconnection detecting apparatus for detecting a state of a wire connecting a current signal output device to an external device, the apparatus comprising:
 a monitoring unit generating different voltages according to whether a current signal input from the current signal output device is applied to the external device;
 a reference voltage generating unit generating a reference voltage;
 a comparing unit outputting a positive voltage or a negative voltage according to the reference voltage and a voltage generated from the monitoring unit; and
 a switching unit configured to be turned on by a negative voltage output from the comparing unit when the voltage generated from the monitoring unit is greater than the reference voltage and to output a disconnection detected signal.

2. The apparatus according to claim 1, wherein the comparing unit comprises an operational amplifier (OP Amp), which receives the voltage generated from the monitoring unit through an inverting input terminal (IN−) and receives the reference voltage through a non-inverting input terminal (IN+).

3. The apparatus according to claim 2, wherein the comparing unit compares the voltages input through the inverting input terminal and the non-inverting input terminal, wherein when the voltage input through the non-inverting input terminal is greater than the voltage input through the inverting input terminal, the comparing unit outputs a negative voltage.

4. The apparatus according to claim 2, wherein the monitoring unit comprises a resistor element connected between a power supply and the inverting input terminal, wherein a contact connected to the resistor element and the inverting input terminal is the contact through which the current signal is output to the external device.

5. The apparatus according to claim 4, wherein the monitoring unit generates:
 a voltage greater than the reference voltage when the current signal applied from the current output device does not flow into the external device, and
 a voltage less than the reference voltage when the current signal flows through the external device.

6. The apparatus according to claim 2, wherein the reference voltage generating unit comprises a plurality of dividing resistor elements connected between a power supply and a ground, and a common contact of the dividing resistor elements is connected to the non-inverting input terminal.

7. The apparatus according to claim 2, wherein the switching unit comprises:
 a transistor turned on and off according to an output voltage of the OP Amp; and
 a resistor element connected between a power supply and a source terminal of the transistor.

8. The apparatus according to claim 7, wherein the transistor has a drain terminal connected to the ground, and outputs the disconnection detected signal through the source terminal.

9. The apparatus according to claim 7, wherein:
 the monitoring unit is connected to the non-inverting input terminal of the OP Amp;
 the reference voltage generating unit is connected to the inverting input terminal; and
 when a positive voltage is input to a gate terminal of the transistor, the switching unit is turned on.

* * * * *